US009324680B2

(12) United States Patent
Mirpuri

(10) Patent No.: US 9,324,680 B2
(45) Date of Patent: Apr. 26, 2016

(54) SOLDER ATTACH APPARATUS AND METHOD

(71) Applicant: Intel Corporation, Santa Clara, CA (US)

(72) Inventor: Kabirkumar Mirpuri, Scottsdale, AZ (US)

(73) Assignee: Intel Corporation, Santa Clara, CA (US)

( * ) Notice: Subject to any disclaimer, the term of this patent is extended or adjusted under 35 U.S.C. 154(b) by 280 days.

(21) Appl. No.: 14/031,414

(22) Filed: Sep. 19, 2013

(65) Prior Publication Data

US 2015/0077962 A1 Mar. 19, 2015

(51) Int. Cl.

| | |
|---|---|
| ***H05K 7/10*** | (2006.01) |
| ***H05K 7/12*** | (2006.01) |
| ***H01L 23/00*** | (2006.01) |
| ***B23K 1/20*** | (2006.01) |
| ***H01L 25/10*** | (2006.01) |
| *H05K 3/34* | (2006.01) |

(52) U.S. Cl.

CPC . *H01L 24/81* (2013.01); *B23K 1/20* (2013.01); *H01L 25/105* (2013.01); *H01L 24/13* (2013.01); *H01L 24/16* (2013.01); *H01L 2224/13101* (2013.01); *H01L 2224/16225* (2013.01); *H01L 2224/81192* (2013.01); *H01L 2924/12042* (2013.01); *H01L 2924/15331* (2013.01); *H01L 2924/1815* (2013.01); *H01L 2924/351* (2013.01); *H05K 3/3436* (2013.01)

(58) Field of Classification Search

USPC ........................... 361/767, 771; 174/258, 257

See application file for complete search history.

(56) References Cited

U.S. PATENT DOCUMENTS

2005/0085013 A1* 4/2005 Ernsberger ............. H01C 1/028 438/108

2014/0008795 A1* 1/2014 Kim ................. H01L 23/49816 257/738

* cited by examiner

*Primary Examiner* — Andargie M Aychillhum

(74) *Attorney, Agent, or Firm* — Schwegman Lundberg & Woessner, P.A.

(57) ABSTRACT

An electronic device including a solder structure and methods of forming an electrical interconnection are shown. Solder structures are shown including a solder ball formed from a first solder having a first melting temperature, and a connecting structure coupling the solder ball to one or more electrical connection pads, the connecting structure formed from a second solder having a second melting temperature lower than the first melting temperature. Electronic devices are shown including a polymer mold material formed over the solder structures.

18 Claims, 4 Drawing Sheets

100
114
118
122
116
120
124
112
110

| SOLDER ALLOY | MELTING POINT (°C) | YIELD STRENGTH (MPA) | TENSILE STRENGTH (MPA) | YOUNG'S MODULUS E(GPA) | PLASTIC STRAIN (%) | NF |
|---|---|---|---|---|---|---|
| Sn–37PB | 183 | 41 | 47 | 27 | 24 | 3650 |
| Sn–0.7Cu | 227 | 20 | 24 | 26 | 44 | 1125 |
| SAC305 | 217 | 28 | 35 | 50 | 33 | 12119 |
| SAC405 | 217 | 30 | 36 | 43 | 31 | 9795 |
| SnCu + In SERIES | | | | | | |
| Sn(0.5–0.7)Cu(3–12)In | 208–213 | 46–51 | 49–57 | 41–58 | 16–17 | 5–18.5K |
| Sn–Bi In SERIES | | | | | | |
| Sn(3–12)Bi(6–10)In | 185–216 | 75 | 67–87 | 39–42 | 0–16 | 0.0005–3.5K |
| SnCu + Bi + In SERIES | | | | | | |
| Sn(0.5–0.6)Cu(3–12)Bi(8–12)In | 183–205 | 47–78 | 58–102 | 42–56 | 0.1–10 | 0.0005–3.3K |
| SAC + In + Zn SERIES | | | | | | |
| Sn0.5Cu(2.5–3)Ag(8–12)In(0.5–4)Zn | 185–206 | 32–53 | 42–59 | 42–58 | 6–7 | 1.8–8.4K |
| Sn–0.5Cu–3Ag–12In–0.5Zn | 185–193 | 36 | 52 | 55 | 6 | 5642 |
| SAC + Bi + In SERIES | | | | | | |
| Sn(1–4.2)Ag–(0.5–3)Cu(1.5–6)Bi(8–12)In | 181–200 | 36–107 | 57–119 | 44–54 | 0.4–13 | 21–111K |
| Sn–0.5Cu–4.1Ag–2.2Bi–12In | 184–194 | 42 | 74 | 48 | 13 | 7256 |
| SnAg + In + Zn SERIES | | | | | | |
| Sn–3Ag–12In–1Zn | 185–197 | 36 | 49 | 59 | 8 | 1469 |

*Fig. 3*

SOLDER ATTACH APPARATUS AND METHOD

TECHNICAL FIELD

Embodiments described herein generally relate to electrical interconnections in microelectronic devices.

BACKGROUND

Microelectronic devices such as IC (integrated circuit) packages may contain low k-value dielectric materials with low mechanical strength. Thermal stresses during manufacture can damage such materials. Some solutions to this problem include providing stiffeners to components such as chips and packages. Other solutions include thickening the components or otherwise changing their geometry to withstand the thermal stresses. Other solutions include choosing materials with better matching thermal expansion coefficients. It is desirable to further improve technologies that reduce damage to electronic components during manufacture.

BRIEF DESCRIPTION OF THE DRAWINGS

FIG. 3 is a chart showing compositions and properties of selected solders for use in electronic devices in accordance with some embodiments of the invention.

DESCRIPTION OF EMBODIMENTS

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

Figure 1:
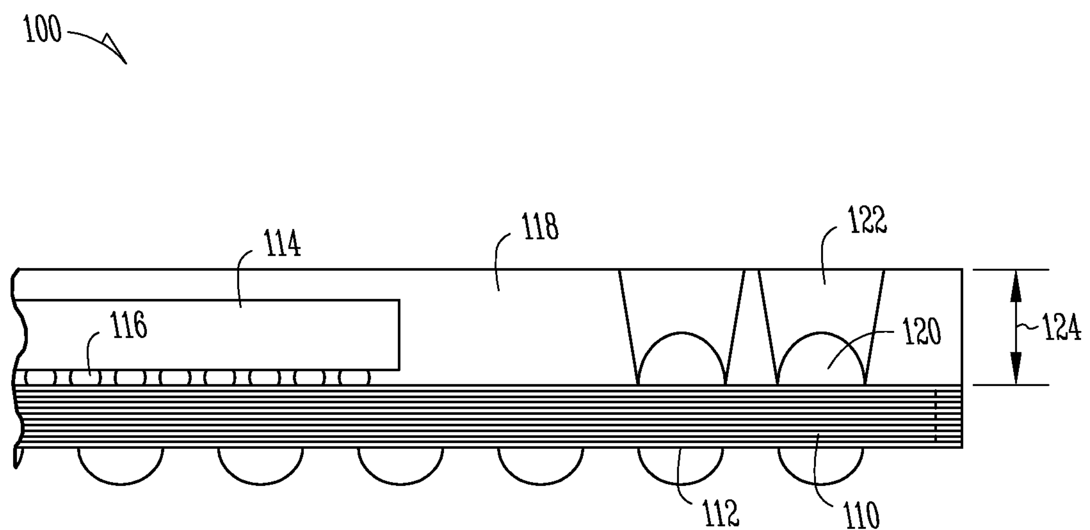
FIG. 1 is a cross section view of an electronic device in accordance with some embodiments of the invention.

FIG. 1 shows a cross-sectional representation of an electronic device 100. In one example, the electronic device 100 includes a substrate 110 with a semiconductor chip 114 coupled to the substrate 110. In the example shown, a number of solder interconnections 116 are used to couple the semiconductor chip 114 to the substrate 110. Examples of semiconductor ships 110 include, but are not limited to processor chips, memory chips, logic chips, etc. In the example shown, additional solder interconnections 112 are shown on a bottom of the substrate 110 for connection to additional devices, such as a circuit board (not shown).

One or more solder structures 120 are also shown attached to the substrate 110. In the example shown, the solder structures 120 are located on a topside of the substrate, for connection to additional devices later mounted to a topside of the electronic device 100. In one example, a polymer mold structure 118 substantially surrounds the one or more solder structures 120, with the solder structures 120 being located in holes 122 in the polymer mold structure 118. In one example of manufacture, the polymer mold structure 118 is molded over previously formed solder structures 120 and the holes 122 are subsequently formed to expose the solder structures 120. Examples of hole 122 formation techniques include, but are not limited to, laser drilling and etching.

A standoff height 124 is indicated in FIG. 1. In one example it is advantageous for the solder structures 120 to be reliably formed with a height that substantially bridges the standoff height 124, to allow for consistent, high quality electrical connections to subsequent electronic devices.

As noted above in one example the solder structures 120 are used for topside interconnections to subsequent electronic devices, such as additional chip packages, however the invention is not so limited. In other example configurations, solder structures such as solder structures 120 are used on bottom side interconnections. Further, although the example of FIG. 1 illustrates a semiconductor chip and substrate, embodiments of the present invention will be beneficial to any electronic device configuration where a solder interconnection is used to bridge a large standoff height through a polymer mold structure.

Figure 2:
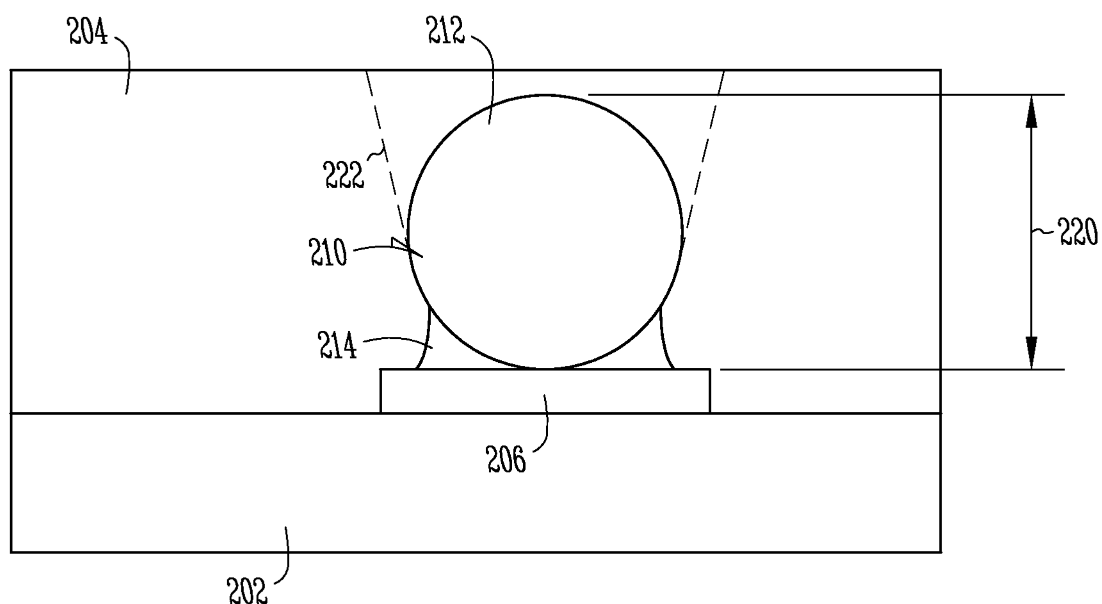
FIG. 2 is a cross sections of a solder structure in accordance with some embodiments of the invention.

FIG. 2 shows a solder structure 210 similar to solder structures 120 from FIG. 1. In the example of FIG. 2, the solder structure 210 is shown coupled to a bond pad 206 on a substrate 202. The solder structure 210 includes a solder ball 212 and a connecting structure 214. A polymer mold structure 204 is shown surrounding the solder structure 210. Although the term "ball" is used to describe component 212, the term is intended to include shapes other than spheres. For example, pillars, squares, ovals, or other shapes are also indented to be included within the term.

As discussed above, in one method, an amount of the polymer mold structure 204 may be removed to provide access to the solder structure 210 for subsequent electrical interconnection. Dashed lines 222 indicate where subsequent drilling or etching will remove a portion of the polymer mold structure 204 to expose the solder structure 210. The solder structure 210 is shown with a height 220 that substantially bridges a height of the polymer mold structure 204.

In one example the polymer mold structure 204 is dispensed and cured over the solder structure 210 before drilling or etching to expose the solder structure 210. During the dispense and cure operation, it can be difficult to maintain the integrity and height 220 of the solder structure 210 due to temperatures in the dispense and cure operation melting one or more components of the solder structure 210. In one example the solder structure 210 is comprised of different solder materials having properties chosen to overcome this technical challenge.

In one example, the solder ball 212 is formed from a first solder having a first melting temperature, and the connecting structure 214 includes a second solder having a second melting temperature lower than the first melting temperature. When the solder structure 210 is later reflowed to form an electrical interconnection, the connecting structure 214 will reflow first, allowing the solder structure 210 to maintain its height 220 and make contact with adjacent circuitry above a height of the polymer mold structure 204. Then, as the solder structure 210 is further reflowed, the solder ball 212, having a higher melting temperature than the connecting structure 214, will reflow to complete the interconnection.

In one example, both the first solder and the second solder are formed from solder materials that have a lower melting temperature than a flowing temperature of the polymer mold structure 204. An example of a flowing temperature of a polymer mold material includes a glass transition temperature, although other softening mechanisms may permit a polymer material to flow sufficiently for examples of the present invention. This permits both the solder ball 212 and the connecting structure 214 of the solder structure 210 to avoid reflowing during a dispense and cure operation used to form the polymer mold structure 204.

In one example the solder ball 212 is formed from a solder having a melting temperature greater than approximately 210° C. In one example the solder ball 212 is formed from a solder having a melting temperature between approximately 246° C. and 252° C. In one example the solder ball 212 is formed from a solder having a melting temperature between approximately 215° C. and 220° C.

A number of solder materials can provide melting temperatures in the ranges specified. The following list of solder systems are given as a non exhaustive list of examples. In one example, the solder ball is formed from a tin based solder. In one example, the solder ball is formed from a tin silver copper based solder. In one example, the solder ball is formed from a tin antimony based solder.

In one example, the connecting structure 214 includes a solder. In one example the connecting structure includes a mixture of flux and solder particles. In one example the connecting structure 214 is formed from a solder having a melting temperature between approximately 180° C. and 200° C. In one example, the connecting structure 214 is formed from a tin silver copper based solder. In one example, the connecting structure 214 is formed from a tin silver copper based solder that further includes indium and zinc. In one example the connecting structure 214 is formed from a tin silver copper based solder that further includes indium and bismuth. In one example the connecting structure 214 is formed from a solder including tin, silver, indium and zinc.

Figure 4:
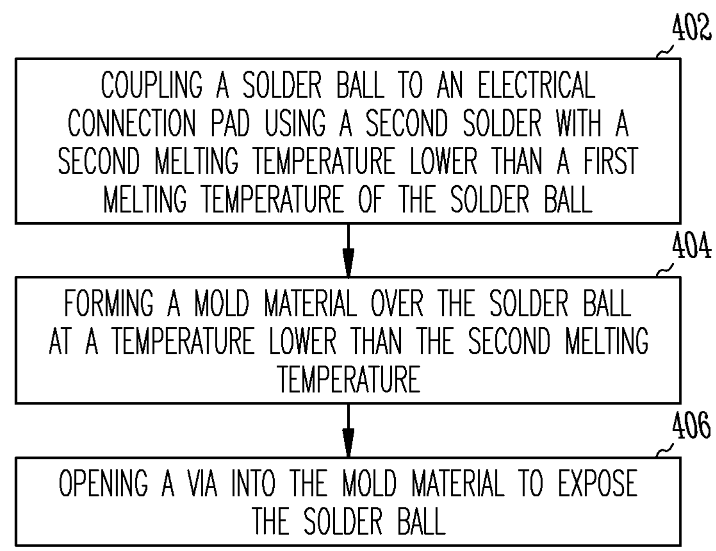
FIG. 4 is a process diagram of a method in accordance with some embodiments of the invention.

FIG. 3 shows a chart of a number of solder materials that may be used as a connecting structure 214 in selected embodiments of the present invention. Although a number of solder examples are shown, the chart is not intended to be exhaustive. Although, as described above, melting point of the connecting structure 214 is important in choosing a material, the chart of FIG. 4 illustrates that a number of other material properties such as yield strength, Young's modulus, strain at fracture, etc. are factored into the material choice. In addition, although solder materials are discussed in the examples, other conductive materials possessing an appropriate melting temperature and other material properties are within the scope of the invention, such as metallic materials other than solder materials.

FIG. 4 shows a flow diagram of a method of forming an electronic device according to an embodiment of the invention. In operation 402, a solder ball is coupled to an electrical connection pad using a second solder with a second melting temperature lower than a first melting temperature of the solder ball. In operation 404, a mold material is formed over the solder ball at a temperature lower than the second melting temperature. In operation 406, a via is opened into the mold material to expose the solder ball.

As discussed above, in one example, the mold material is dispensed and cured over the solder ball. In one example, the mold material is extruded under pressure at an elevated temperature sufficient to flow the mold material, with a subsequent cure. In one example, the mold material has a flowing temperature between approximately 100° C. and 180° C. Embodiments of the present invention will also be useful in processes other than dispense and cure where heat is applied, and integrity of a solder structure is beneficial. As discussed above, although processes such as laser drilling or etching may be used to open up vias, other methods of forming a hole over solder structures are also within the scope of the invention.

Figure 5:
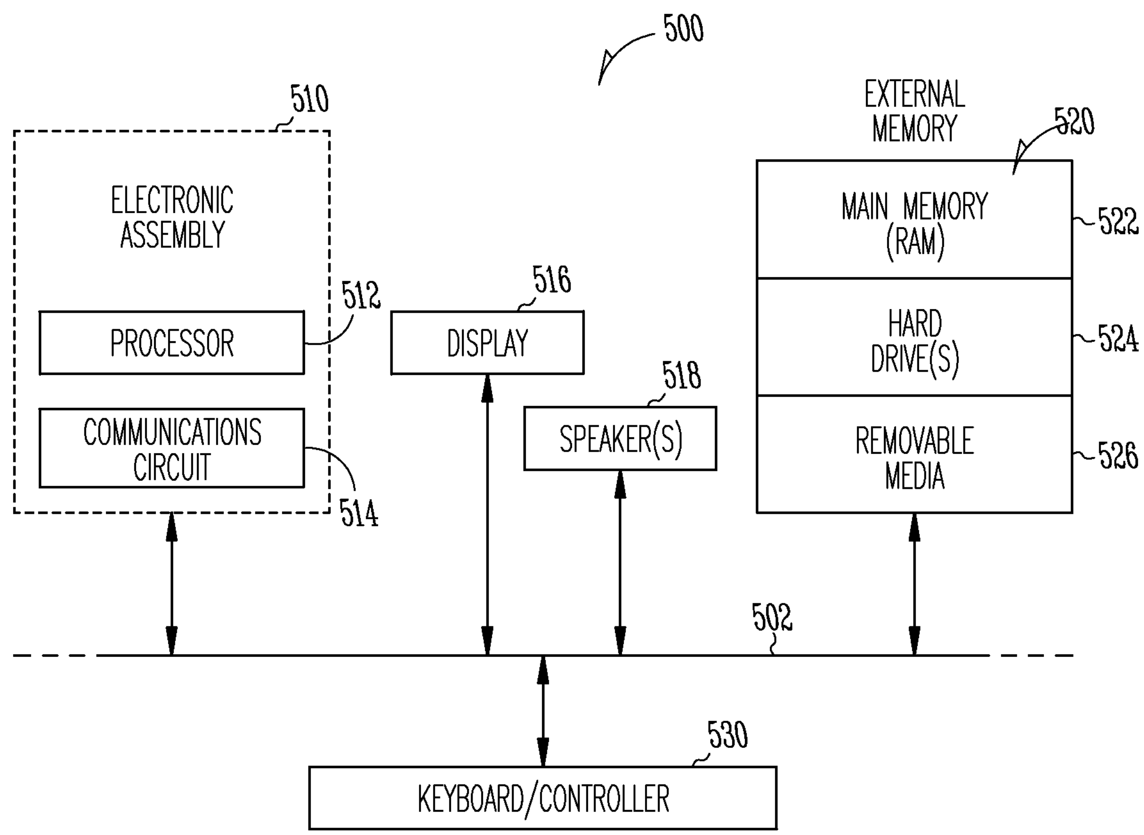
FIG. 5 is block diagram of an electronic system in accordance with some embodiments of the invention.

An example of an electronic device using electronic devices and solders as described in the present disclosure is included to show an example of a higher level device application for the present invention. FIG. 5 is a block diagram of an electronic device 500 incorporating at least one solder and/or method in accordance with at least one embodiment of the invention. Electronic device 500 is merely one example of an electronic system in which embodiments of the present invention can be used. Examples of electronic devices 500 include, but are not limited to personal computers, tablet computers, mobile telephones, game devices, MP3 or other digital music players, etc. In this example, electronic device 500 comprises a data processing system that includes a system bus 502 to couple the various components of the system. System bus 502 provides communications links among the various components of the electronic device 500 and can be implemented as a single bus, as a combination of busses, or in any other suitable manner.

An electronic assembly 510 is coupled to system bus 502. The electronic assembly 510 can include any circuit or combination of circuits. In one embodiment, the electronic assembly 510 includes a processor 512 which can be of any type. As used herein, "processor" means any type of computational circuit, such as but not limited to a microprocessor, a microcontroller, a complex instruction set computing (CISC) microprocessor, a reduced instruction set computing (RISC) microprocessor, a very long instruction word (VLIW) microprocessor, a graphics processor, a digital signal processor (DSP), multiple core processor, or any other type of processor or processing circuit.

Other types of circuits that can be included in electronic assembly 510 are a custom circuit, an application-specific integrated circuit (ASIC), or the like, such as, for example, one or more circuits (such as a communications circuit 514) for use in wireless devices like mobile telephones, personal data assistants, portable computers, two-way radios, and similar electronic systems. The IC can perform any other type of function.

The electronic device 500 can also include an external memory 520, which in turn can include one or more memory elements suitable to the particular application, such as a main memory 522 in the form of random access memory (RAM), one or more hard drives 524, and/or one or more drives that handle removable media 526 such as compact disks (CD), flash memory cards, digital video disk (DVD), and the like.

The electronic device 500 can also include a display device 516, one or more speakers 518, and a keyboard and/or controller 530, which can include a mouse, trackball, touch screen, voice-recognition device, or any other device that permits a system user to input information into and receive information from the electronic device 500.

To better illustrate the method and apparatuses disclosed herein, a non-limiting list of embodiments is provided here:

Example 1 includes a solder connection for an integrated circuit including a substrate and a number of electrical connection pads, and one or more solder structures coupled to the number of electrical connection pads, the solder structures including a solder ball formed from a first solder having a first melting temperature a connecting structure coupling the solder ball to one or more electrical connection pads, the connecting structure formed from a second solder having a second melting temperature lower than the first melting temperature; and a polymer mold structure surrounding the one or more solder structure and formed from a polymer having a glass transition temperature lower than the second melting temperature.

Example 2 includes the solder connection of example 1 wherein the solder ball is formed from a solder having a melting temperature greater than approximately 210° C.

Example 3 includes the solder connection of any one of examples 1-2, wherein the solder ball is formed from a solder having a melting temperature between approximately 246° C. and 252° C.

Example 4 includes the solder connection of any one of examples 1-3, wherein the solder ball is formed from a solder having a melting temperature between approximately 215° C. and 220° C.

Example 5 includes the solder connection of any one of examples 1-4, wherein the solder ball is a tin based solder.

Example 6 includes the solder connection of any one of examples 1-5, wherein the solder ball is a tin antimony based solder.

Example 7 includes the solder connection of any one of examples 1-6, wherein the connecting structure includes solder.

Example 8 includes the solder connection of any one of examples 1-7, wherein the connecting structure includes mixed flux and solder particles.

Example 9 includes the solder connection of any one of examples 1-8, wherein the connecting structure is formed from a solder having a melting temperature between approximately 180° C. and 210° C.

Example 10 includes the solder connection of any one of examples 1-9, wherein the connecting structure is formed from a tin silver copper based solder.

Example 11 includes the solder connection of any one of examples 1-10, wherein the tin silver copper based solder further includes indium and zinc.

Example 12 includes the solder connection of any one of examples 1-11, wherein the tin silver copper based solder further includes indium and bismuth.

Example 13 includes the solder connection of any one of examples 1-12, wherein the connecting structure is formed from a solder including tin, silver, indium and zinc.

Example 14 includes a solder connection for an integrated circuit, including a first chip package, and a semiconductor chip coupled to the top side of a substrate, a number of electrical connection pads located on the top side of the substrate and spaced laterally apart from the semiconductor chip, one or more solder structures coupled to the number of electrical connection pads, the solder structures including, a solder ball formed from a first solder having a first melting temperature, a connecting structure coupling the solder ball to one or more electrical connection pads, the connecting structure formed from a second solder having a second melting temperature lower than the first melting temperature, and a polymer mold structure surrounding the semiconductor chip and the one or more solder structure and formed from a polymer having a flowing temperature lower than the second melting temperature.

Example 15 includes the solder connection of example 14 the solder ball is formed from a solder having a melting temperature greater than approximately 210° C.

Example 16 includes the solder connection of any one of examples 14-15, wherein the connecting structure is formed from a solder having a melting temperature between approximately 180° C. and 210° C.

Example 17 includes the solder connection of any one of examples 14-16, wherein the polymer mold structure has a flowing temperature between approximately 100° C. and 180° C.

Example 18 includes the solder connection of any one of examples 14-17, further including a second chip package stacked on top of the first chip package, and coupled to the first chip package using the one or more solder structures.

Example 19 includes a method of making an interconnection structure for an integrated circuit, comprising coupling a solder ball to an electrical connection pad using a second solder with a second melting temperature lower than a first melting temperature of the solder ball, forming a mold material over the solder ball at a temperature lower than the second melting temperature, and opening a via into the mold material to expose the solder ball.

Example 20 includes the method of example 19 wherein forming the mold material include extruding under pressure and curing the mold material over the solder ball.

Example 21 includes the method of any one of examples 19-20, wherein opening a via into the mold material includes laser drilling.

Example 22 includes the method of any one of examples 19-21, wherein opening a via into the mold material includes etching.

Example 23 includes the method of any one of examples 19-22, wherein coupling the solder ball to an electrical connection pad includes coupling a solder ball to an electrical connection pad on a topside of a first semiconductor chip package substrate.

Example 24 includes the method of any one of examples 19-23, further including bonding a second semiconductor chip package to the topside of the first semiconductor chip package, and electrically connecting the first semiconductor chip package to the second semiconductor chip package by reflowing the solder ball and the second solder.

These and other examples and features of the present electronic device, solder compositions, and related methods will be set forth in part in the following detailed description. This overview is intended to provide non-limiting examples of the present subject matter—it is not intended to provide an exclusive or exhaustive explanation. The detailed description below is included to provide further information about the present molds, mold systems, and methods.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms “first,” “second,” and “third,” etc. are used merely as labels, and are not intended to impose numerical requirements on their objects.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. §1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The invention claimed is:

1. An electronic device, comprising:

a substrate, including a number of electrical connection pads;

one or more solder structures coupled to the number of electrical connection pads, the solder structures including;

a solder ball formed from a first solder having a first melting temperature;

a connecting structure coupling the solder ball to one or more electrical connection pads, the connecting structure formed from a second solder having a second melting temperature lower than the first melting temperature; and a polymer mold structure surrounding the one or more solder structure and formed from a polymer having a glass transition temperature lower than the second melting temperature.

2. The electronic device of claim 1, wherein the solder ball is formed from a solder having a melting temperature greater than approximately 210° C.

3. The electronic device of claim 2, wherein the solder ball is formed from a solder having a melting temperature between approximately 246° C. and 252° C.

4. The electronic device of claim 2, wherein the solder ball is formed from a solder having a melting temperature between approximately 215° C. and 220° C.

5. The electronic device of claim 4, wherein the solder ball is a tin based solder.

6. The electronic device of claim 2, wherein the solder ball is a tin antimony based solder.

7. The electronic device of claim 1, wherein the connecting structure includes solder.

8. The electronic device of claim 7, wherein the connecting structure includes mixed flux and solder particles.

9. The electronic device of claim 1, wherein the connecting structure is formed from a solder having a melting temperature between approximately 180° C. and 210° C.

10. The electronic device of claim 9, wherein the connecting structure is formed from a tin silver copper based solder.

11. The electronic device of claim 10, wherein the tin silver copper based solder further includes indium and zinc.

12. The electronic device of claim 10, wherein the tin silver copper based solder further includes indium and bismuth.

13. The electronic device of claim 9, wherein the connecting structure is formed from a solder including tin, silver, indium and zinc.

14. An electronic device, comprising:

a first chip package, including a semiconductor chip coupled to the top side of a substrate;

a number of electrical connection pads located on the top side of the substrate, and spaced laterally apart from the semiconductor chip;

one or more solder structures coupled to the number of electrical connection pads, the solder structures including;

a solder ball formed from a first solder having a first melting temperature;

a connecting structure coupling the solder ball to one or more electrical connection pads, the connecting structure formed from a second solder having a second melting temperature lower than the first melting temperature; and a polymer mold structure surrounding the semiconductor chip and the one or more solder structure and formed from a polymer having a flowing temperature lower than the second melting temperature.

15. The electronic device of claim 14, wherein the solder ball is formed from a solder having a melting temperature greater than approximately 210° C.

16. The electronic device of claim 15, wherein the connecting structure is formed from a solder having a melting temperature between approximately 180° C. and 210° C.

17. The electronic device of claim 16, wherein the polymer mold structure has a flowing temperature between approximately 100° C. and 180° C.

18. The electronic device of claim 14, further including a second chip package stacked on top of the first chip package, and coupled to the first chip package using the one or more solder structures.

* * * * *